(12) United States Patent
Wu

(10) Patent No.: US 8,945,984 B2
(45) Date of Patent: Feb. 3, 2015

(54) BUMP-ON-TRACE METHODS AND STRUCTURES IN PACKAGING

(71) Applicant: Taiwan Semiconductor Manufacturing Company, Ltd., Hsin-Chu (TW)

(72) Inventor: Jiun Yi Wu, Zhongli (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/781,215

(22) Filed: Feb. 28, 2013

(65) Prior Publication Data

US 2014/0239505 A1 Aug. 28, 2014

(51) Int. Cl.
 *H01L 21/56* (2006.01)
 *H01L 23/00* (2006.01)
 *H01L 23/538* (2006.01)

(52) U.S. Cl.
 CPC ............ *H01L 24/27* (2013.01); *H01L 23/5386* (2013.01); *H01L 24/83* (2013.01)
 USPC ..... 438/107; 438/129; 438/612; 257/E21.507

(58) Field of Classification Search
 USPC .......... 438/107–108, 129, 612–616; 257/E21.501, E21.507
 See application file for complete search history.

(56) References Cited

U.S. PATENT DOCUMENTS

2009/0191329 A1* 7/2009 Wang ............................ 427/96.2
2012/0285924 A1* 11/2012 Lee et al. ......................... 216/13

* cited by examiner

*Primary Examiner* — Thanhha Pham
(74) *Attorney, Agent, or Firm* — Slater & Matsil, L.L.P.

(57) ABSTRACT

A method and structure for bump-on-trace bonding is provided. In an embodiment traces to be used for bump-on-trace (BOT) bonding are protected during a pre-solder treatment. The pre-solder treatment improves the adhesion between the exposed traces (e.g., the non-BOT traces) and a solder resist layer.

19 Claims, 6 Drawing Sheets

BUMP-ON-TRACE METHODS AND STRUCTURES IN PACKAGING

BACKGROUND

Bump-on-Trace (BOT) structures and techniques are used in flip chip packages, wherein metal bumps are bonded onto narrow metal traces in package substrates directly, rather than bonded onto metal pads that have greater widths than the respective connecting metal traces. The BOT structures require smaller chip areas, and the manufacturing cost of the BOT structures is lower. The BOT structures may achieve the same reliability as the conventional bond structures that are based on metal pads.

BOT structures may sometimes suffer from peeling-off or delamination. For example, during processing, undercut regions may form on the traces. These undercut regions coupled with stress generated by a mismatch between the coefficient of thermal expansion (CTE) of the device die and the CTE of the package substrate may increase the likelihood of peeling-off or delamination in the resulting package.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

Figure 1:
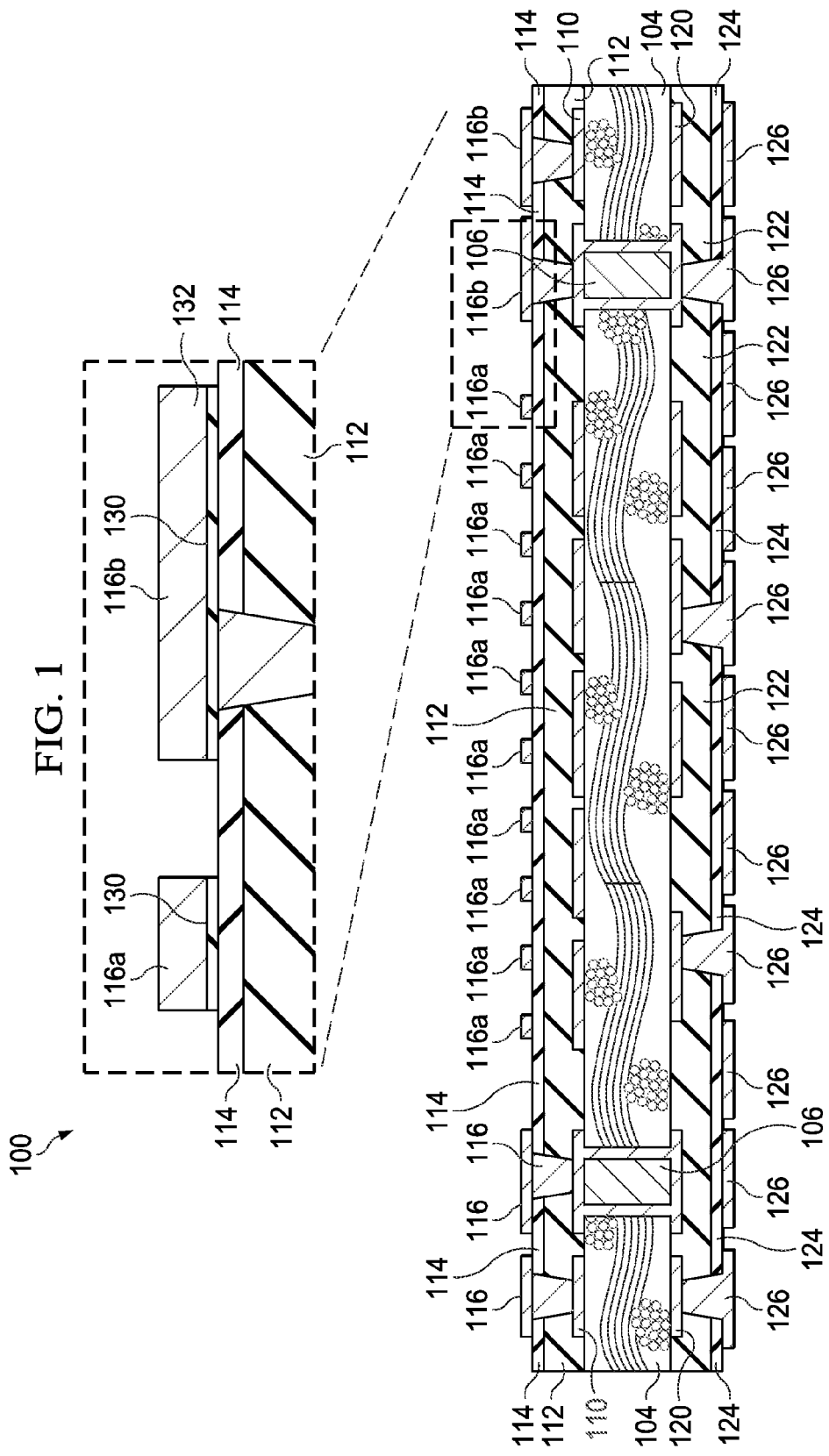
FIGS. 1-5 illustrate various intermediate steps of forming a bump-on-trace structure in accordance with an embodiment.

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

FIGS. 1-5 illustrate various intermediate stages of forming a package structure comprising Bump-On-Trace (BOT) structures and techniques in accordance with various embodiments. Variations of the embodiments are discussed. Throughout the various views and illustrative embodiments, like reference numerals are used to designate like elements.

Referring first to FIG. 1, there is illustrated a cross-sectional view of a substrate 100 in accordance with an embodiment. The substrate 100 may be a package substrate, although it may be another type of substrate, such as an interposer, a die, wafer, or the like. In an embodiment, the substrate 100 comprises a core layer 104 and electrical connectors 106, e.g., through vias, penetrating through the core layer 104 to provide electrical connections on opposing sides of the substrate 100. The core layer 104 may be formed of, for example, glass, although other dielectric materials may be used.

The substrate 100 may include one or more first metallization layers 110 formed in corresponding first dielectric layers 112 on a first side of the substrate 100, and one or more second metallization layers 120 formed in corresponding second dielectric layers 122 on an opposing side of the substrate 100. The electrical connectors 106 may provide electrical connections between corresponding ones of the first metallization layers 110 and the second metallization layers 120.

It is noted that FIG. 1 illustrates a single metallization layer on each side of the substrate 100 for illustrative purposes. Other embodiments may include any number of metallization layers on each side of the substrate 100, and the number of layers on each side of the substrate may be different. The metallization layers may include one or more redistribution layers to provide different pin-out configurations and provide connectivity between connected components, e.g., between dies, between dies and other substrates, and the like.

A first adhesion layer 114 and a second adhesion layer 124 may be formed over the first dielectric layers 112 and the second dielectric layers 122, respectively, to provide better adhesive properties for an overlying metal layer, such as a seed layer, discussed in greater detail below. In an embodiment, the first adhesion layer 114 and the second adhesion layer 124 may comprise an organic layer, such as polyamide 6 (Nylon 6), which provides good adhesive qualities to a metallic seed layer.

First metal lines 116 and second metal lines 126 provide contacts for external components, such as integrated circuit dies, and/or other substrates. In an embodiment, BOT techniques may be utilized to connect another substrate, such as an integrated circuit die, to the substrate 100. In the embodiment illustrated in FIG. 1, the first metal lines 116 include BOT traces 116a and non-BOT traces 116b, wherein the BOT traces 116a are generally characterized by narrower trace widths than the non-BOT traces 116b. The narrower widths of the BOT traces 116a make the BOT traces 116a more susceptible to delamination.

As illustrated in the inset of FIG. 1, the BOT traces 116a and non-BOT traces 116b may include a seed layer 130 and an overlying metal layer 132. Generally, the seed layer 130 may be blanket deposited by, for example, an electroless plating process, a physical vapor deposition (PVD) process, or the like. A mask (not shown) may be applied and patterned over the seed layer 130 and the metal layer 132 may be formed using an electroplating process. The mask and the excess seed layer may be subsequently removed, thereby creating the structure illustrated in FIG. 1. Due to the methods used to create the seed layer 130 and the overlying metal layer 132, the seed layer 130 may be more susceptible to removal or deterioration during subsequent processing, thereby creating an undercut region.

FIG. 1 illustrates the substrate 100 for illustrative purposes. It is realized that the structure of the substrate 100 may vary. For example, the number of the metallization layers and dielectric layers may vary and may include one or more redistribution layers. Furthermore, the substrate 100 may include laminated layers, and may not include a core. As other examples, the substrate 100 may include processed wafers/semiconductor dies, interposers, packaging substrates, circuit boards, or the like.

Figure 2:
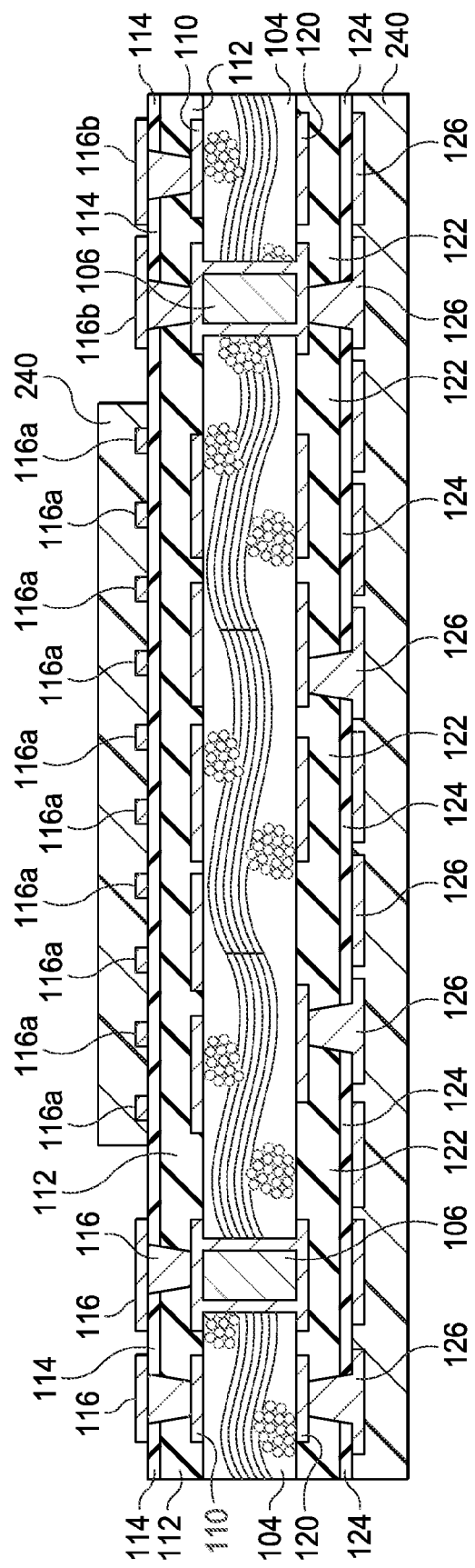

FIG. 2 illustrates a patterned mask 240 formed over select ones of the first metal lines 116 and the second metal lines 126 in accordance with an embodiment. In an embodiment, a photoresist material that has been masked, exposed, and developed is used for the patterned mask 240. Generally, a blanket layer of photoresist material is deposited and patterned by irradiating (exposing) in accordance to a mask pattern and developed to remove a portion of the photoresist material. The remaining photoresist material protects the underlying material from subsequent processing steps. In the embodiment illustrated in FIG. 2, the patterned mask 240 is used to protect the BOT traces 116a on a first side of the substrate 100 and the second metal lines 126 on a second side of the substrate 100. The non-BOT traces 116b are exposed and will be subjected to a solder resist pre-treatment as discussed below.

Figure 3:
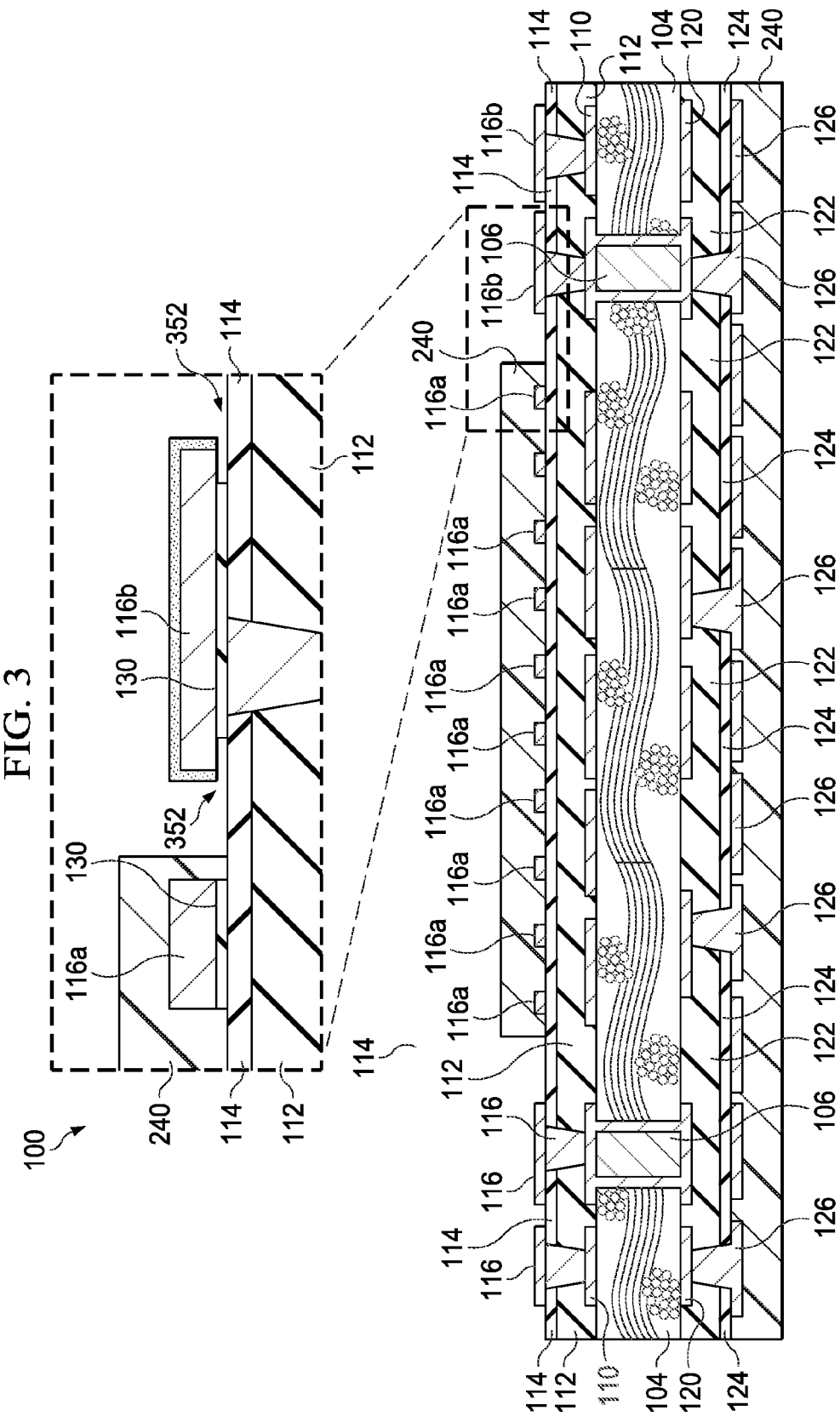

FIG. 3 illustrates the substrate 100 after a solder pre-treatment in accordance with an embodiment. The solder resist pre-treatment may comprise, for example, a wet pre-treatment in $CH_3COOH$ (acetic acid). Generally, the solder resist pre-treatment roughens the surface of the exposed non-BOT traces 116b (illustrated by the shaded region 350 along the exterior of the non-BOT traces 116b in the inset in FIG. 3) and allows for better adhesion between the exposed metal traces (e.g., the non-BOT traces 116b) and a subsequently formed solder resist.

In another embodiment, the solder resist pre-treatment may be a dry treatment, such as a plasma treatment using an oxygen-containing gas. After the oxygen-containing plasma treatment, the surface of 116b will form a thin oxide layer with a thickness greater ten nanometers. Other embodiments may utilize other types of plasma, such as a plasma treatment of Argon or nitrogen.

In an embodiment, the non-BOT traces 116b exhibit a roughness Ra of greater than 0.5 µm (e.g., 0.8 µm 1.0 µm, and 1.5 µm), and the BOT traces 116a exhibit a roughness Ra of less than 0.1 µm. Other roughness Ra may be used. For example, the roughness of the non-BOT traces 116b may be any value that provides sufficient roughness to allow good adhesion between the non-BOT traces 116b and an overlying layer.

In embodiments such as where a copper seed layer 130 is used to form a copper trace, the solder pre-treatment may remove portions of the copper seed layer resulting in an undercut region 352. The non-BOT traces 116b are generally wider than the BOT traces 116a. The narrower width of the BOT traces 116a coupled with the undercut region makes the BOT traces 116a susceptible to delamination. By protecting the BOT traces 116a with the patterned mask 240, the seed layer 130 of the BOT traces 116a is protected, thereby preventing or reducing an undercut of the BOT traces 116a during the solder pre-treatment, thereby reducing delamination.

Figure 4:
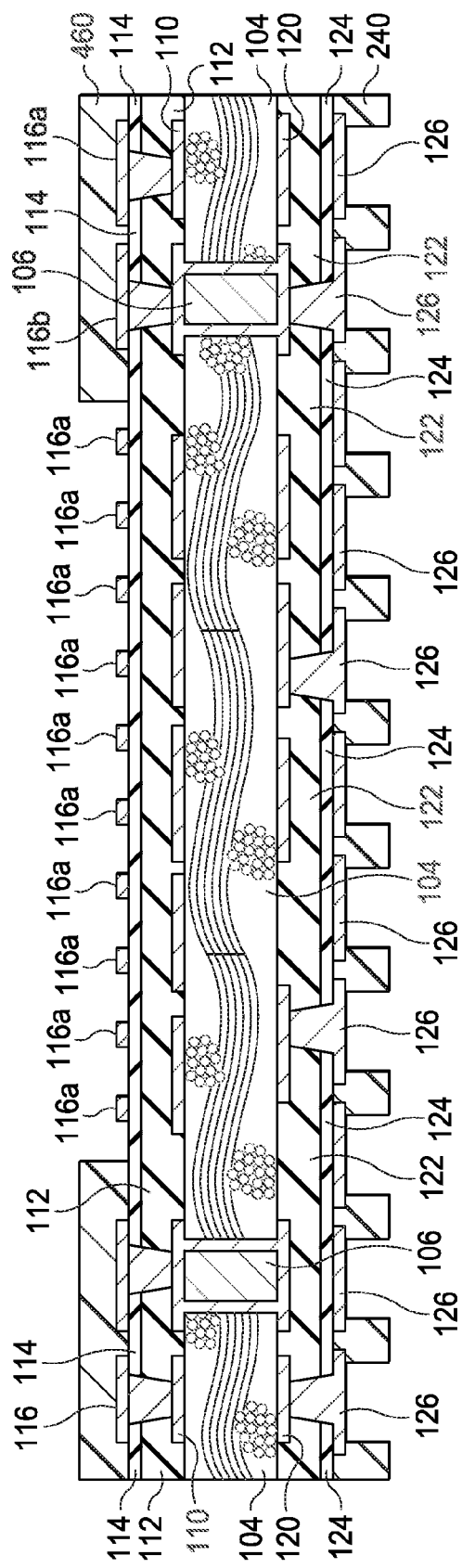

FIG. 4 illustrates the substrate 100 after removal of the patterned mask 240 and formation of a solder resist layer 460, or other dielectric material, applied in accordance with an embodiment. The solder resist layer 460 may be, for example, a polymer formed and patterned over the first and second surfaces of the substrate 100. Along the first side of the substrate, the BOT traces 116a are exposed, thereby allowing an electrical connection to be formed thereto. The roughened surface of the non-BOT traces 116b provides better adhesives properties between the non-BOT traces 116b and the solder resist layer 460.

The non-BOT traces 116b are covered with the solder resist layer 460. It should be noted that all of the non-BOT traces 116b are shown as being covered by the solder resist layer 460 for illustrative purposes. In some embodiments, another component may be coupled to the non-BOT traces 116b, in which case a portion of the non-BOT traces 116b may be exposed to allow contact to be made. In embodiments in which the non-BOT traces 116b act as a redistribution layer between the BOT-traces 116a and the electrical connections 106, the non-BOT traces 116b may be completely covered by the solder resist layer 460.

Figure 5:
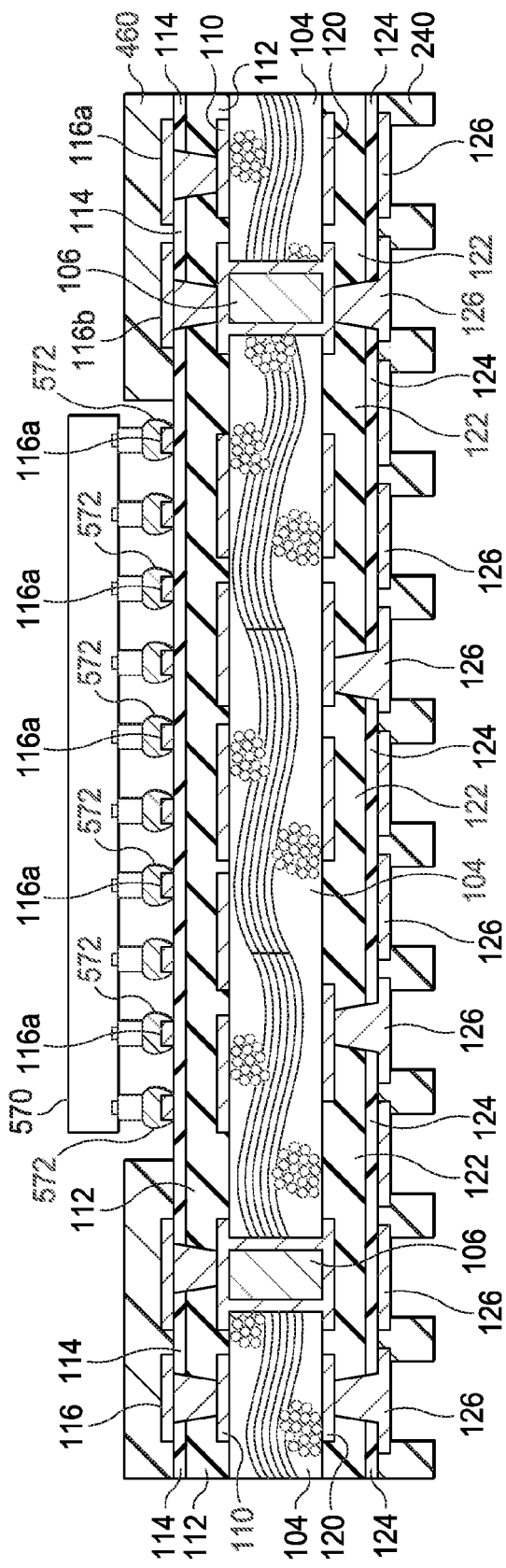

FIG. 5 illustrates an integrated circuit die 570 bonded to the substrate 100 in accordance with an embodiment. The integrated circuit die 570 is aligned and placed into contact with the substrate 100. After alignment and placement, a bonding process is performed to bond the conductive bumps 572 onto corresponding ones of the BOT traces 116a. The bonding process may comprise a thermal reflow process wherein the conductive bumps 572 are heated to melt the material of the conductive bumps 572, thereby causing the conductive bumps 572 to bond to corresponding ones of the BOT traces 116a.

Thereafter, subsequent processes may be performed to complete the semiconductor device. For example, a molding underfill (MUF) may be formed between the integrated circuit die and the substrate, other components may be coupled to the substrate, an encapsulant may be formed over the integrated circuit die 570, and the like.

It should be appreciated that embodiments such as those described above provide greater reliability and performance. For example, by protecting the smaller BOT traces, the undercut region of the BOT traces can be reduced while allowing the larger non-BOT traces to be roughened, thereby allowing better adhesion between the non-BOT traces and the molding compound.

Figure 6:
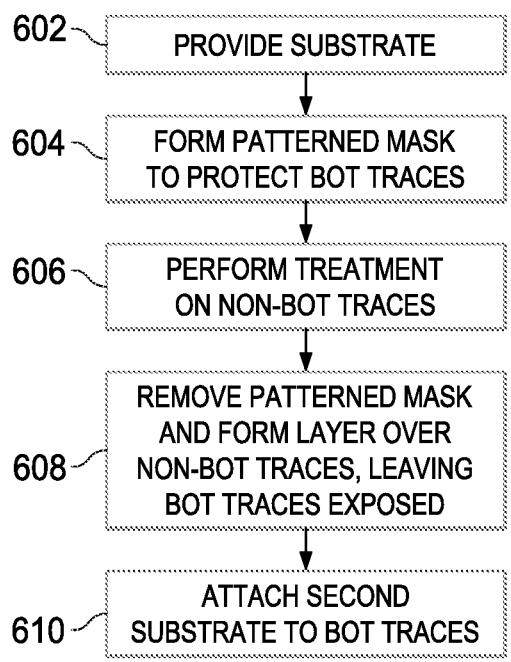
FIG. 6 is a flowchart illustrating a method of forming a BOT device in accordance with an embodiment.

FIG. 6 is a flow chart illustrating the steps of forming a BOT structure in accordance with an embodiment. The process begins in step 602, wherein a substrate is provided, such as a substrate described above with reference to FIG. 1. In step 604, a patterned mask is formed over the BOT traces to protect the BOT traces during subsequent processing. Next, in step 606, the exposed traces, e.g., exposed non-BOT traces, are treated. The treatment may roughen the surface of the exposed traces to provide better adhesion to overlying layers. In step 608, the patterned mask is removed and a layer, e.g., a solder resist mask, is formed over the non-BOT traces, leaving the BOT traces exposed. Thereafter, in step 610, a second substrate, such as an integrated circuit die, is attached to the BOT traces using BOT techniques.

In an embodiment, a method of forming an electrical device is provided. The method includes providing a first substrate having a first trace and a second trace, and forming a mask over the first trace. The second trace is treated while the first trace is protected by the mask. The mask is removed and a protective layer is formed over the second trace.

In another embodiment, another method of forming an electrical device is provided. In this embodiment, a first substrate having a first trace and a second trace is provided. The surface of the second trace is roughened and an undercut region is formed in the second trace along a surface of the first substrate, such that the undercut region in the second trace is greater than an undercut region in the first trace.

In yet another embodiment, an electrical device is provided. The electrical device includes a substrate, a first trace on the substrate, and a second trace on the substrate, the second substrate having an undercut region greater than the first trace.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method of forming an electrical device, the method comprising:
   providing a first substrate having a first trace and a second trace;
   forming a mask over the first trace;
   treating the second trace while the first trace is protected by the mask, the treating forming a treated portion of the second trace, wherein the treating roughens a surface of the second trace;
   removing the mask; and
   forming a protective layer directly over the treated portion of the second trace.

2. The method of claim 1, further comprising attaching a second substrate to the first trace.

3. The method of claim 2, wherein attaching comprises attaching to the first trace using ball-on-trace.

4. The method of claim 1, wherein the treating comprises a treatment with acetic acid or an oxygen-containing plasma.

5. The method of claim 1, wherein the first trace and the second trace comprises a seed layer and an overlying metal layer, and wherein the treating creates an undercut region in the seed layer under the metal layer of the second trace.

6. The method of claim 1, wherein, after the treating, a roughness Ra of the second trace is greater than 0.5 μm.

7. The method of claim 1, wherein, after the treating, a roughness Ra of the first trace is less than 0.1 μm.

8. A method of forming an electrical device, the method comprising:
   providing a first substrate having a first trace and a second trace;
   roughening a surface of the second trace; and
   forming an undercut region in the second trace along a surface of the first substrate, the undercut region in the second trace being greater than an undercut region in the first trace.

9. The method of claim 8, wherein the roughening and the forming is performed in a same step.

10. The method of claim 8, wherein the undercut region in the second trace is a recessed seed layer.

11. The method of claim 8, further comprising forming a solder resist layer over the second trace.

12. The method of claim 8, wherein, after the roughening, a roughness Ra of the second trace is greater than 0.5 μm.

13. The method of claim 8, wherein, after the roughening, a roughness Ra of the first trace is less than 0.1 μm.

14. A method of forming an electrical device, the method comprising:
   providing a first substrate having a plurality of traces;
   protecting a first set of traces, the first set of traces being a subset of the plurality of traces;
   roughening a surface of a second set of traces while the first set of traces is protected, the second set of traces being a subset of the plurality of traces; and
   connecting a second substrate to the first substrate with a bump-on-trace using the first set of traces.

15. The method of claim 14, wherein the roughening is performed at least in part by a treatment with acetic acid or an oxygen-containing plasma.

16. The method of claim 14, further comprising forming an undercut region below individual ones of the second set of traces.

17. The method of claim 16, wherein the undercut region is formed in a seed layer of the second set of traces.

18. The method of claim 14, further comprising forming a solder resist over the second set of traces after the roughening.

19. The method of claim 14, wherein, after the roughening, a roughness of the first set of traces is less than a roughness of the second set of traces.

* * * * *